(12) United States Patent
Li

(10) Patent No.: US 10,911,143 B2
(45) Date of Patent: Feb. 2, 2021

(54) VISIBLE LIGHT COMMUNICATION DEVICE AND METHOD FOR DRIVING THE SAME, DOOR LOCK AND VISIBLE LIGHT COMMUNICATION METHOD

(71) Applicant: BOE Technology Group Co., Ltd., Beijing (CN)

(72) Inventor: Wenbo Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/519,601

(22) Filed: Jul. 23, 2019

(65) Prior Publication Data

US 2020/0028589 A1    Jan. 23, 2020

(30) Foreign Application Priority Data

Jul. 23, 2018    (CN) .......................... 2018 1 0814716

(51) Int. Cl.
*H04B 10/00* (2013.01)
*H04B 10/116* (2013.01)
*H01L 27/12* (2006.01)

(52) U.S. Cl.
CPC ........ *H04B 10/116* (2013.01); *H01L 27/1214* (2013.01); *H01L 2227/32* (2013.01)

(58) Field of Classification Search
CPC .................................................. H04B 10/116
See application file for complete search history.

(56) References Cited

U.S. PATENT DOCUMENTS

| 2008/0030492 | A1* | 2/2008 | Lee .................... G02F 1/1333 345/207 |
| 2008/0302970 | A1* | 12/2008 | Fujieda ................ G01T 1/2018 250/370.11 |
| 2008/0310857 | A1* | 12/2008 | Fuse .................. H04B 10/1121 398/154 |
| 2009/0002265 | A1 | 1/2009 | Kitaoka et al. |
| 2009/0052902 | A1* | 2/2009 | Shinokura ........... H04B 10/116 398/118 |

(Continued)

FOREIGN PATENT DOCUMENTS

CN    1989716 A    6/2007
CN    202473188 U    10/2012

(Continued)

OTHER PUBLICATIONS

First Office Action dated Jul. 30, 2019, for corresponding Chinese application No. 201810814716.3, with English translation.

*Primary Examiner* — David C Payne
*Assistant Examiner* — Pranesh K Barua
(74) *Attorney, Agent, or Firm* — Nath, Goldberg & Meyer; Joshua B. Goldberg

(57) ABSTRACT

The present disclosure provides a visible light communication device and a method for driving the same, a door lock and a visible light communication method. The visible light communication device includes an array substrate, the array substrate including a display region having a plurality of pixels and a photosensitive region having at least one photosensitive sensor, the at least one photosensitive sensor is configured to convert a received visible light signal carrying encoded information into an electric signal.

12 Claims, 5 Drawing Sheets

(56) References Cited

U.S. PATENT DOCUMENTS

| | | | |
|---|---|---|---|
| 2010/0033450 A1* | 2/2010 | Koyama | G06F 3/042 345/175 |
| 2010/0054748 A1* | 3/2010 | Sato | H04B 10/1149 398/130 |
| 2010/0129087 A1* | 5/2010 | Kim | H04B 10/1149 398/182 |
| 2010/0194721 A1* | 8/2010 | Miyata | G09G 3/2096 345/206 |
| 2010/0247112 A1* | 9/2010 | Chang | H04B 10/116 398/182 |
| 2011/0249037 A1* | 10/2011 | Koyama | G02F 1/1368 345/690 |
| 2012/0280783 A1* | 11/2012 | Gerhardt | H04W 12/003 340/5.6 |
| 2013/0120321 A1* | 5/2013 | Nemoto | G06F 3/042 345/175 |
| 2014/0010549 A1* | 1/2014 | Kang | H04B 10/116 398/118 |
| 2014/0023378 A1* | 1/2014 | Bae | G06Q 30/02 398/128 |
| 2015/0003836 A1* | 1/2015 | Yamasaki | H04B 10/116 398/118 |
| 2015/0139659 A1* | 5/2015 | Oshima | H04N 5/23293 398/118 |
| 2015/0187258 A1* | 7/2015 | Lee | G06K 9/00604 345/207 |
| 2016/0020855 A1* | 1/2016 | Guetta | H04B 10/116 398/130 |
| 2017/0324539 A1* | 11/2017 | Liu | H04B 10/50 |
| 2018/0191437 A1* | 7/2018 | Cha | H04B 10/516 |
| 2018/0227051 A1* | 8/2018 | Shim | H04B 1/38 |
| 2018/0227756 A1* | 8/2018 | Chang | H04W 12/0605 |
| 2018/0239034 A1* | 8/2018 | Tian | G01T 1/2018 |
| 2019/0007136 A1* | 1/2019 | Ye | H01L 27/1446 |
| 2019/0088184 A1* | 3/2019 | Morein | G06F 3/0446 |
| 2019/0099096 A1 | 4/2019 | Wang et al. | |

FOREIGN PATENT DOCUMENTS

| | | |
|---|---|---|
| CN | 102983907 A | 3/2013 |
| CN | 106330313 A | 1/2017 |
| CN | 106959757 A | 7/2017 |
| CN | 107492317 A | 12/2017 |

\* cited by examiner

VISIBLE LIGHT COMMUNICATION DEVICE AND METHOD FOR DRIVING THE SAME, DOOR LOCK AND VISIBLE LIGHT COMMUNICATION METHOD

CROSS-REFERENCE TO RELATED APPLICATIONS

The present disclosure claims the priority of Chinese Patent Application No. 201810814716.3, filed on Jul. 23, 2018, the contents of which are incorporated herein in their entirety by reference.

TECHNICAL FIELD

The present disclosure relates to the field of communication technology, and in particular, to a visible light communication device and a method for driving the visible light communication device, a door lock and a visible light communication method.

BACKGROUND

Visible light communication technology is also called as light fidelity (LiFi) technology, and is a technology using visible light as a transmission medium for communication.

SUMMARY

An embodiment of the present disclosure provides a visible light communication device, including an array substrate, the array substrate comprising a display region having a plurality of pixels and a photosensitive region having at least one photosensitive sensor, wherein the at least one photosensitive sensor is configured to convert a received visible light signal carrying encoded information into an electric signal.

In some implementations, the photosensitive region and the display region are separated from each other.

In some implementations, the at least one photosensitive sensor is provided among the plurality of pixels.

In some implementations, the at least one photosensitive sensor includes a plurality of photosensitive sensors, and the plurality of photosensitive sensors and the plurality of pixels are arranged alternatively.

In some implementations, the plurality of photosensitive sensors and the plurality of pixels are arranged in an array, the photosensitive sensors and the pixels in each row are arranged alternatively, and the photosensitive sensors and the pixels in each column are arranged alternatively.

In some implementations, the at least one photosensitive sensor includes a photosensitive sensing layer and a first thin film transistor provided above a base substrate, the photosensitive sensing layer includes an output electrode, a photoelectric conversion layer and an input electrode provided above the base substrate successively, the first thin film transistor includes a first gate electrode, a first gate insulation layer, a first active layer, a first electrode and a second electrode formed above the base substrate, and the output electrode of the photosensitive sensing layer is electrically coupled to the second electrode of the first thin film transistor.

In some implementations, the second electrode of the first thin film transistor includes a part extending to a side of the output electrode of the photosensitive sensing layer proximal to the base substrate, so that the second electrode of the first thin film transistor is electrically coupled to the output electrode of the photosensitive sensing layer directly.

In some implementations, the array substrate further includes a pixel definition layer provided above the base substrate, each of the plurality of pixels includes a second thin film transistor and a light emitting element provided above the base substrate, the pixel definition layer includes a first opening and a second opening, the light emitting element and the photosensitive sensing layer are respectively located in the first opening and the second opening, and the first thin film transistor and the second thin film transistor are located between a non-opening region of the pixel definition layer and the base substrate.

In some implementations, the second thin film transistor includes a second gate electrode, a second gate insulation layer, a second active layer, a third electrode and the fourth electrode provided above the base substrate, a passivation layer and the light emitting element are successively provided above the third electrode and the fourth electrode of the second thin film transistor, a first conductive layer is provided on the passivation layer, and a first via-hole is provided at a position of the passivation layer corresponding to the fourth electrode of the second thin film transistor, the first conductive layer includes a part provided in the first via-hole and a part extending to a side of the first electrode of the light emitting element proximal to the base substrate, and the fourth electrode of the second thin film transistor is electrically coupled to the first electrode of the light emitting element through the first conductive layer.

In some implementations, the passivation layer is further provided above the first electrode and the second electrode of the first thin film transistor, a second conductive layer is provided on the passivation layer, and a second via-hole is provided at a position of the passivation layer corresponding to the second electrode of the first thin film transistor, the second conductive layer includes a part provided in the second via-hole and a part extending to a side of the output electrode of the photosensitive sensing layer proximal to the base substrate, and the second electrode of the first thin film transistor is electrically coupled to the output electrode of the photosensitive sensing layer through the second conductive layer.

In some implementations, the first gate electrode of the first thin film transistor and the second gate electrode of the second thin film transistor are provided in a single layer, the first gate insulation layer of the first thin film transistor and the second gate insulation layer of the second thin film transistor are provided in a single layer, the first active layer of the first thin film transistor and the second active layer of the second thin film transistor are provided in a single layer, the first electrode of the first thin film transistor, the second electrode of the first thin film transistor, the third electrode of the second thin film transistor and the fourth electrode of the second thin film transistor are provided in a single layer, the light emitting element includes the first electrode, a light emitting layer and a second electrode successively provided above the passivation layer, the first conductive layer, the second conductive layer, the output electrode of the photosensitive sensing layer and the first electrode of the light emitting element are provided in a single layer, and the input electrode of the photosensitive sensing layer and the second electrode of the light emitting element are provided in a single layer.

In some implementations, the array substrate further includes a light blocking layer which is provided in a third opening of the pixel definition layer, and the third opening is located between the first opening and the second opening.

An embodiment of the present disclosure provides a door lock including the visible light communication device as above.

An embodiment of the present disclosure provides a method for driving the visible light communication device as above, and the method includes: providing a photosensitive driving signal to the at least one photosensitive sensor of the array substrate of the visible light communication device during a first time period to drive the at least one photosensitive sensor to operate; and providing a display driving signal to the plurality of pixels of the array substrate of the visible light communication device during a second time period to drive the plurality of pixels to operate, the first time period is different from the second time period.

In some implementations, a display time period of the array substrate for displaying each frame of image is divided into the first time period and the second time period.

An embodiment of the present disclosure provides a visible light communication method for the visible light communication device as above, and the visible light communication method includes: acquiring a first electric signal by the at least one photosensitive sensor in the photosensitive region of the array substrate in a case where no visible light signal carrying encoded information arrives at the photosensitive region of the array substrate of the visible light communication device and the pixels of the display region of the array substrate are in off state; acquiring a second electric signal by the at least one photosensitive sensor in the photosensitive region of the array substrate in a case where no visible light signal carrying encoded information arrives at the photosensitive region of the array substrate of the visible light communication device and the pixels of the display region of the array substrate are in on state; acquiring a third electric signal by the at least one photosensitive sensor in the photosensitive region of the array substrate in a case where a visible light signal carrying encoded information arrives at the photosensitive region of the array substrate of the visible light communication device and the pixels of the display region of the array substrate are in on state; and calculating a difference between the second electric signal and the first electric signal, and subtracting the difference from the third electric signal to obtain the visible light signal carrying encoded information.

DESCRIPTION OF DRAWINGS

Accompany drawings are a part of specification for showing embodiments of the present disclosure and explaining principles of technical solutions of the present disclosure.

DESCRIPTION OF EMBODIMENTS

Exemplary embodiments will be described in detail below by referring to the accompany drawings. Unless otherwise specified, the same signs in different drawings represent the same or similar elements. Implementations described in the following exemplary embodiments do not represent all implementations consistent with the present disclosure, but are only examples of devices and methods consistent with some aspects of the present disclosure.

In visible light communication technology, a light emitting source may flicker up to millions of times per second, but such flicker is invisible for human's eyes. The visible light communication technology is applicable in various fields due to characteristics such as wide transmission frequency band, good confidentiality and strong anti-electromagnetic-interference ability.

Figure 1:
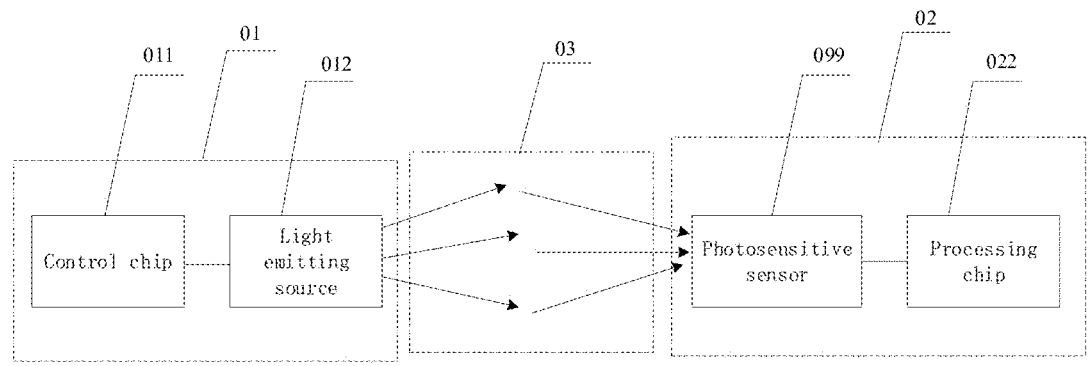
FIG. 1 shows a block diagram of a visible light communication system in related art.

FIG. 1 shows a block diagram of a visible light communication system. As shown in FIG. 1, the visible light communication system includes a transmitter 01 and a receiver 02, a visible light transmission channel 03 is provided between the transmitter 01 and the receiver 02, and the visible light transmission channel 03 may be any abstract or specific path (such as cable, optical fiber, microwave, shortwave, etc.) capable of transmitting a visible light signal.

The transmitter 01 includes a control chip 011 and a light emitting source 012. The light emitting source 012 may be, for example, a light emitting diode (LED) or a laser diode, and the control chip 011 may be, for example, a digital signal processing (DSP) chip.

The receiver 02 includes a photosensitive sensor 099 and a processing chip 022.

The control chip 011 can generate a control signal for controlling the light emitting source 012 so that the light emitting source 01 flickers at a certain frequency, such flicker due to on and off of the light emitting source 012 can produce a visible light signal in a form of pulses at a certain frequency. The control chip 011 may load information to be transmitted onto the visible light signal and encode the visible light signal to generate a visible light signal carrying encoded information, and the visible light signal may be transmitted to the receiver 02 through the visible light transmission channel 03. The photosensitive sensor 099 of the receiver 02 converts the received visible light signal into an electric signal, the processing chip 022 may convert the electric signal into a digital signal and perform decoding to obtain the information transmitted, and thereby a transmission of the information is achieved.

Figure 2:
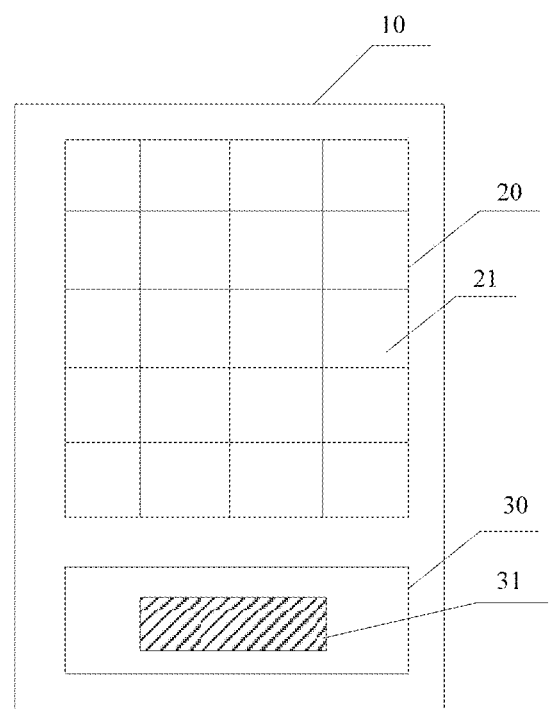
FIG. 2 shows a plan structural diagram of an array substrate of a visible light communication device in accordance with an embodiment of the present disclosure.

An embodiment of the present disclosure provides a visible light communication device including an array substrate. As shown in FIG. 2, the array substrate includes a base substrate 10, and the base substrate 10 is divided for a display region 20 and a photosensitive region 30. A plurality of pixels 21 are provided in the display region 20 and at least one photosensitive sensor 31 is provided in the photosensitive region 30. The at least one photosensitive sensor 31 is configured to convert a received visible light signal carrying encoded information into an electric signal.

The base substrate 10 is a substrate for supporting the plurality of pixels 21 and the at least one photosensitive sensor 31, and may be a hard substrate (such as a glass substrate) or a flexible substrate.

The pixels 21 refer to minimal elements for displaying an image, and each pixel 21 is used for display a single color such as red, green, blue or the like. An image may be displayed by the pixels 21 arranged in an array. A resolution of the image is relating to a dimension of each pixel 21, the resolution refers to the number of pixels per inch, and the higher the resolution is, the smaller the dimension of each pixel 21 is.

The photosensitive sensor provided in the photosensitive region is an element for converting a visible light signal into an electric signal, is sensitive to visible light, and can convert the received visible light signal carrying encoded information into an electric signal. The encoded information may be obtained by demodulating the electric signal through a related element (e.g., demodulator).

The encoded information is the information obtained by encoding related data information according to certain rules, the related data information is the information which needs to be transmitted by using visible light, for example, for the visible light communication device applied to an entrance guard system, the related data information may be unlock password, user identity information or the like.

The visible light communication device of the embodiment may be used as a receiver of a visible light communication system, the base substrate of the array substrate of the visible light communication device is divided for the display region and the photosensitive region, the pixels in the display region may be used for displaying an image, the photosensitive sensor in the photosensitive region may be used for achieving visible light communication, by integrating the photosensitive region and the display region together on the single base substrate, an integration of the visible light communication device may be improved.

In some implementations, the photosensitive region and the display region may be separated from each other, that is, the photosensitive region and the display region may be different regions of the base substrate, which are not intersect with each other.

Regions of the base substrate for the display region and the photosensitive region are generally quadrilateral, the photosensitive region may be a non-display region of the base substrate, that is, a region of the base substrate may be reserved for the photosensitive region, and the photosensitive region may be any region of the base substrate except the display region. For example, as shown in FIG. 2, the photosensitive region 30 is located below the display region 20. Certainly, the photosensitive region may also be located above, or at a left or right side of the display region.

Figure 3:
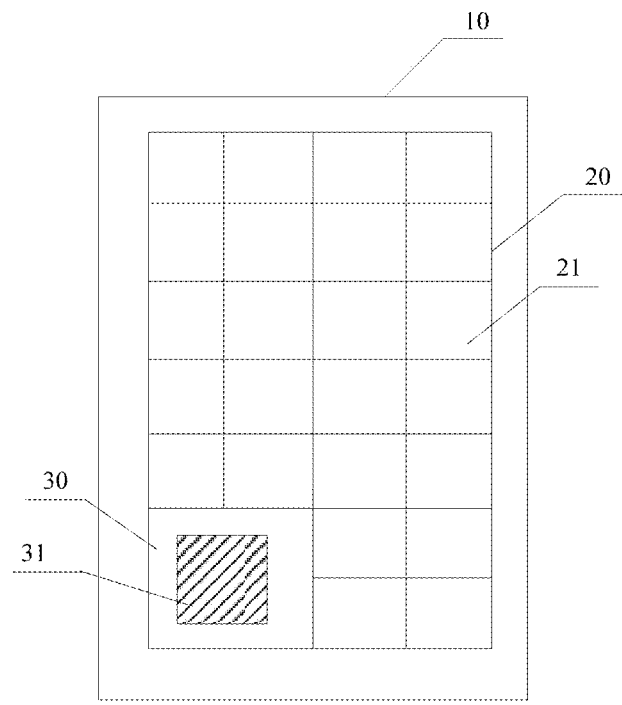
FIG. 3 shows a plan structural diagram of an array substrate of a visible light communication device in accordance with an embodiment of the present disclosure.

In some implementations, the photosensitive region may also be a corner of the base substrate, the remaining region of the base substrate may be the display region. In such case, the display region and the photosensitive region may be adjacent to each other. For example, as shown in FIG. 3, the photosensitive region may be at least one corner of the base substrate, and the region of the base substrate other than the photosensitive region is the display region.

Since the display region is for displaying an image, the photosensitive region is not for displaying, different regions of the base substrate being used as the display region and the photosensitive region respectively can reduce an influence of the photosensitive region on displaying of the display region.

In some implementations, the at least one photosensitive sensor in the photosensitive region may be provided among the plurality of pixels in the display region, that is, the photosensitive region may be provided in the display region.

In some implementations, the at least one photosensitive sensor in the photosensitive region may include a plurality of photosensitive sensors, and the plurality of photosensitive sensors in the photosensitive region and the plurality of pixels in the display region may be provided alternatively.

Since the photosensitive region needs to occupy a certain area of the base substrate, the area of the display region of the base substrate for displaying an image is reduced. In a case where a plurality of photosensitive sensors are provided in the photosensitive region, if the plurality of photosensitive sensors are centralized in a certain region of the base substrate, a relative large area of the base substrate (i.e., the area occupied by the photosensitive region) cannot be used for displaying, which will affect user's experiences to some extent.

In the embodiment, by providing the plurality of photosensitive sensors in the photosensitive region and the plurality of pixels in the display region alternatively, the photosensitive sensors are dispersed among the pixels, an overall display effect of the display region is unaffected, and user's experiences are improved.

Specifically, the photosensitive sensors may be dispersed among the pixels evenly and relatively centralized in a certain region, which is helpful to receive a visible light signal through the photosensitive sensors and achieve an improved sensitivity.

Figure 4:
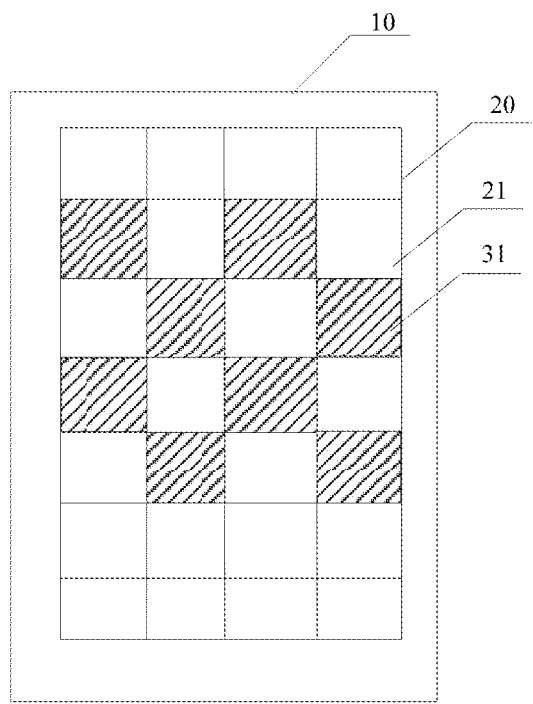
FIG. 4 shows a plan structural diagram of an array substrate of a visible light communication device in accordance with an embodiment of the present disclosure.

In some implementations, as shown in FIG. 4, the pixels and the photosensitive sensors are arranged in an array, the photosensitive sensors and the pixels in each row are arranged alternatively, and the photosensitive sensors and the pixels in each column are arranged alternatively.

Figure 5:
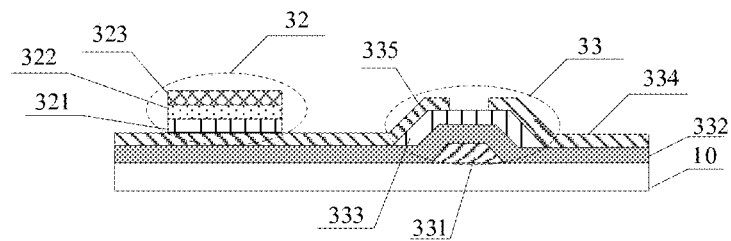
FIG. 5 shows a sectional structural diagram of a portion including a photosensitive sensor of an array substrate of a visible light communication device in accordance with an embodiment of the present disclosure.

FIG. 5 illustratively shows a sectional structural diagram of a portion including a photosensitive sensor of an array substrate. As shown in FIG. 5, the photosensitive sensor includes a photosensitive sensing layer 32 and a first thin film transistor 33 provided above the base substrate 10.

The photosensitive sensing layer 32 includes an output electrode 321, a photoelectric conversion layer 322 and an input electrode 323 successively provided on the base substrate 10.

The output electrode 321 of the photosensitive sensing layer 32 is coupled to a second electrode 335 of the first thin film transistor 33.

The photoelectric conversion layer 322 of the photosensitive sensing layer 32 is configured to convert a visible light signal into an electric signal, the input electrode 323 of the photosensitive sensing layer 32 may be configured to input a driving signal, and the output electrode 321 of the photosensitive sensing layer 32 may be configured to output the electric signal converted from the visible light signal. Since the output electrode 321 of the photosensitive sensing layer 32 is electrically coupled to the second electrode 335 of the first thin film transistor 33, the electric signal may be amplified by the first thin film transistor 33 and then output to a related element (e.g., a processor, or a demodulator, etc.) to be processed, so that the encoded information carried by the visible light signal is obtained.

The photosensitive sensor of the embodiment may include a photodiode. The photodiode may be a PIN photodiode (also known as PIN junction diode or PIN diode). The PIN photodiode includes a P type region, an N type region and an intrinsic region between the P type region and the N type region. A PN junction is formed between the P type region and the N type region. Since the intrinsic region is a high resistance region with respect to the P type region and the N type region, an internal electric field of the PN junction is substantially centralized in the intrinsic region. The intrinsic region has a low dopant concentration, is almost an intrinsic semiconductor, thus is also called as an I layer. Most of incident light is absorbed by the I layer and a large number of electron-hole pairs are generated and form a current, which can convert a visible light signal into an electric signal, and the electric signal may be output through an output electrode. The photosensitive sensing layer 32 may include the P type region, the N type region and the intrinsic region as above.

Referring to FIG. 5 continuously, the first thin film transistor 33 may include a first gate electrode 331, a first gate insulation layer 332, a first active layer 333, a first electrode 334 and a second electrode 335 formed above the base substrate 10.

The second electrode 335 of the first thin film transistor 33 may include a part extending to a side of the output electrode 321 of the photosensitive sensing layer 32 proximal to the base substrate 10, so that the second electrode 335 of the first thin film transistor 33 can be electrically coupled to the output electrode 321 of the photosensitive sensing layer 32.

The first thin film transistor may be a bottom gate thin film transistor as shown in FIG. 5, the first gate electrode 331, the first gate insulation layer 332, the first active layer 333, a source and drain layer including the first electrode 334 and the second electrode 335 are successively formed on the base substrate 10, but the first thin film transistor is not limited to the bottom gate thin film transistor. The first thin film transistor may also be a top gate thin film transistor, and the top gate thin film transistor may include an active layer, a source and drain layer including a first electrode and a second electrode, a gate insulation layer and a gate electrode successively formed on a base substrate.

The first electrode of the first thin film transistor may be one of a source electrode and a drain electrode of the first thin film transistor, and the second electrode may be the other of the source electrode and the drain electrode of the first thin film transistor, which are not limited herein.

In the embodiment, the second electrode 335 of the first thin film transistor 33 directly extends to the side of the output electrode 321 of the photosensitive sensing layer 32 proximal to the base substrate 10, thus the second electrode 335 of the first thin film transistor 33 is directly in contact with the side of the output electrode 321 of the photosensitive sensing layer 32 proximal to the base substrate, thereby the second electrode 335 of the first thin film transistor 33 is electrically coupled to the output electrode 321 of the photosensitive sensing layer 32 directly, then the photoelectric conversion layer 322 and the input electrode 323 may be successively formed on the output electrode 321 of the photosensitive sensing layer 32, in such way, the structure of the photosensitive sensor may be simplified.

Figure 6:
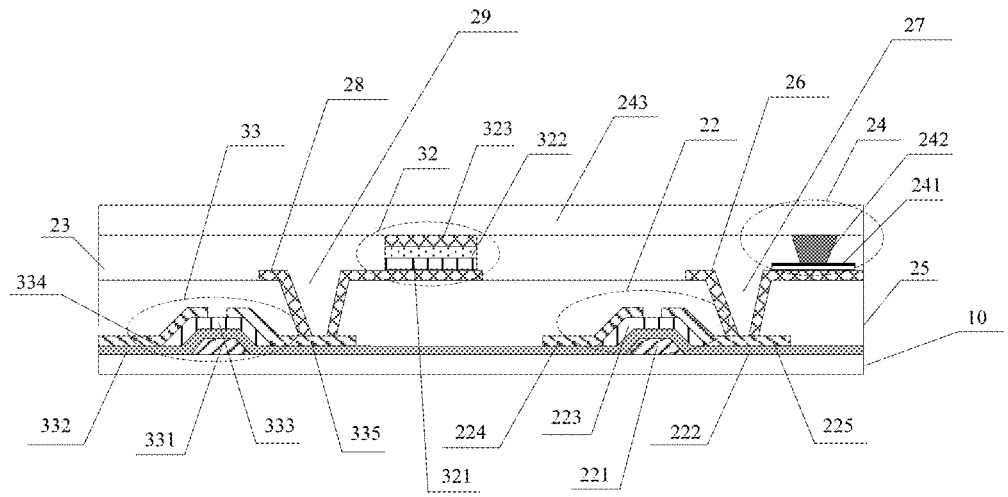
FIG. 6 shows a sectional structural diagram of an array substrate of a visible light communication device in accordance with an embodiment of the present disclosure.

FIG. 6 shows a sectional structural diagram of an array substrate of the visible light communication device in the embodiment. As shown in FIG. 6, the array substrate may further include a pixel definition layer 23, and each pixel may include a second thin film transistor 22 and a light emitting element (e.g., organic light emitting element) 24 provided on the base substrate 10.

Each of the photosensitive sensing layer 32 of the photosensitive sensor and the organic light emitting element 24 of the pixel may be provided in an opening of the pixel definition layer 23, and for example, the organic light emitting element 24 and the photosensitive sensing layer 32 may be provided in different openings of the pixel definition layer 23.

In the embodiment, each pixel includes the organic light emitting element, thus may be used for forming an array substrate of an organic light emitting diode (OLED) display panel. Certainly, each pixel may include a thin film transistor, a pixel electrode, a common electrode etc. for forming an array substrate of a liquid crystal display panel, or each pixel may include other structures, which are not limited herein.

The second thin film transistor 22 is a driving transistor of the organic light emitting element 24, and may be a transistor the same as or different from the first thin film transistor 33.

The pixel definition layer 23 may be an insulation layer having an opening for defining the organic light emitting element 24 of each pixel.

For the array substrate in which the pixel includes the organic light emitting element, light cannot transmit through the non-opening region of the pixel definition layer, thus the first thin film transistor of the photosensitive sensor and the second thin film transistor of each pixel may be provided at positions in the non-opening region of the pixel definition layer, in such way, no additional area will be occupied by the first thin film transistor of the photosensitive sensor and the second thin film transistor of each pixel, which is helpful to improve an aperture ratio of the array substrate.

In some examples, as shown in FIG. 6, the pixel definition layer 23 includes a first opening and a second opening, the organic light emitting element 24 of the pixel is located in the first opening of the pixel definition layer 23, the photosensitive sensing layer 32 of the photosensitive sensor is located in the second opening of the pixel definition layer 23, the first thin film transistor 33 of the photosensitive sensor and the second thin film transistor 22 of the pixel may be located between the non-opening region of the pixel definition layer 23 and the base substrate 10.

Referring to FIG. 6 again, the second thin film transistor 22 includes a second gate electrode 221, a second gate insulation layer 222, a second active layer 223, a third electrode 224 and a fourth electrode 225 provided above the base substrate 10, a passivation layer 25 and the organic light emitting element 24 are successively provided above the third electrode 224 and the fourth electrode 225, a first conductive layer 26 is provided on the passivation layer 25, a first via-hole 27 is provided at a position of the passivation layer 25 corresponding to the fourth electrode 225, the first conductive layer 26 includes a part located in the first via-hole 27 and a part extending to a side of the first electrode 241 of the organic light emitting element 24 proximal to the base substrate 10, thus the fourth electrode 225 of the second thin film transistor 22 is electrically coupled to the first electrode 241 of the organic light emitting element 24 through the first conductive layer 26.

In the embodiment, the passivation layer is provided between the second thin film transistor and the organic light emitting element, in order to couple the fourth electrode of the second thin film transistor to the first electrode of the organic light emitting element, the first via-hole is provided in the passivation layer, and the first conductive layer is provided on the passivation layer, the first conductive layer incudes the part in the first via-hole and the part extending to a bottom of the first electrode of the organic light emitting element, the fourth electrode of the second thin film transistor may be electrically coupled to the first electrode of the organic light emitting element through the first conductive layer.

The third electrode of the second thin film transistor may be one of a source electrode and a drain electrode of the second thin film transistor, and the fourth electrode of the second thin film transistor may be the other of the source electrode and the drain electrode of the second thin film transistor, which are not limited herein.

In some examples, as shown in FIG. 6, the passivation layer 25 may also be provided above the first electrode 334 and the second electrode 335 of the first thin film transistor 33, and a second conductive layer 28 is further provided on the passivation layer 25, a second via-hole 29 is provided at a position of the passivation layer 25 corresponding to the second electrode 335 of the first thin film transistor 33, the second conductive layer 28 includes a part in the second via-hole 29 and a part extending to a side of the output electrode 321 of the photosensitive sensing layer 32 proximal to the base substrate 10, thereby the second electrode 335 of the first thin film transistor 33 can be electrically coupled to the output electrode 321 of the photosensitive sensing layer 32 through the second conductive layer 28.

In the embodiment, the passivation layer is also provided between the first thin film transistor and the photosensitive sensing layer, the second via-hole is provided in the passivation layer, and the second conductive layer is provided on the passivation layer, the second conductive layer includes the part in the second via-hole and the part extending to the bottom of the output electrode of the photosensitive sensing layer, thus the second electrode of the first thin film transistor can be electrically coupled to the output electrode of the photosensitive sensing layer through the second conductive layer.

Figure 7:
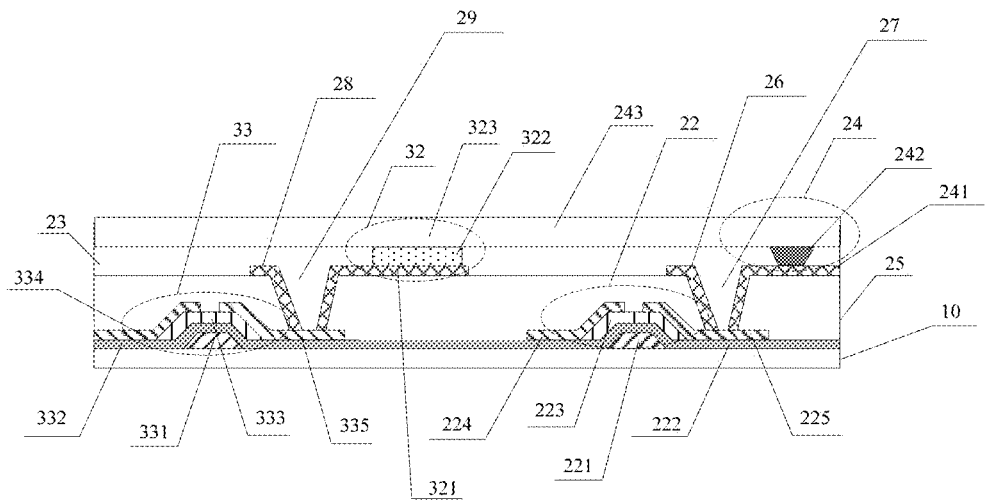
FIG. 7 shows a sectional structural diagram of an array substrate of a visible light communication device in accordance with an embodiment of the present disclosure.

In some implementations, as shown in FIG. 7, the first gate electrode 331 of the first thin film transistor 33 and the second gate electrode 221 of the second thin film transistor 22 may be provided in a single layer, the first gate insulation layer 332 of the first thin film transistor 33 and the second gate insulation layer 222 of the second thin film transistor 22 may be provided in a single layer, the first active layer 333 of the first thin film transistor 33 and the second active layer 223 of the second thin film transistor 22 may be provided in a single layer, the first electrode 334 of the first thin film transistor 33, the second electrode 335 of the first thin film transistor 33, the third electrode 224 of the second thin film transistor 22 and the fourth electrode 225 of the second thin film transistor 22 may be provided in a single layer. The light emitting element 24 may include the first electrode 241, an organic light emitting layer 242 and a second electrode 243 successively provided above the passivation layer 25. The first conductive layer 26, the second conductive layer 28, the output electrode 321 of the photosensitive sensing layer 32 and the first electrode 241 of the organic light emitting element 24 may be provided in a single layer. The input electrode 323 of the photosensitive sensing layer 32 and the second electrode 243 of the organic light emitting element 24 may be provided in a single layer.

In the embodiment, each layer of the first thin film transistor and the corresponding layer of the second thin film transistor may be located in a single layer, respectively, the first thin film transistor and the second thin film transistor may adopt structures the same with each other, thus each layer of the first thin film transistor and the corresponding layer of the second thin film transistor may be formed by using a same material through a single patterning process, thereby a simplified manufacturing procedure is achieved.

Since all the output electrode of the photosensitive sensing layer, the first conductive layer, the second conductive layer and the first electrode of the organic light emitting element may be formed of conductive material, the output electrode of the photosensitive sensing layer, the first conductive layer, the second conductive layer and the first electrode of the organic light emitting element may be formed in a single layer by using a same material through a single patterning process, and the input electrode of the photosensitive sensing layer and second electrode of the organic light emitting element may also be formed by using a same material through a single patterning process, which can further simplify the manufacturing procedure.

It should be noted that, since the output electrode of the photosensitive sensing layer is coupled to the second conductive layer, and the output electrode of the photosensitive sensing layer and the second conductive layer are in a single layer, the output electrode of the photosensitive sensing layer and the second conductive layer may be integrated, that is, the second conductive layer may also be used as the output electrode of the photosensitive sensing layer. Similarly, the first conductive layer is coupled to the first electrode of the organic light emitting element, and the first conductive layer and the first electrode of the organic light emitting element are in a single layer, thus the first conductive layer and the first electrode of the organic light emitting element may also be integrated, that is, the first conductive layer may also be used as the first electrode of the organic light emitting element, which can further simplify the structure and the manufacturing procedure of the array substrate.

Moreover, signals input to the input electrode of the photosensitive sensing layer and the second electrode of the organic light emitting element may be the same with each other, the input electrode of the photosensitive sensing layer and the second electrode of the organic light emitting element may also be integrated, that is, the second electrode of the organic light emitting element may also be used as the input electrode of the photosensitive sensing layer.

As shown in FIGS. 6 and 7, the organic light emitting element 24 may include the first electrode 241, the organic light emitting layer 242 and the second electrode 243, the first electrode 241 may be one of an anode and a cathode, the second electrode 243 may be the other of the anode and the cathode, the organic light emitting layer 242 may include structures such as a hole inject layer (HIL), a hole transport layer (HTL), a light emitting layer, an electron transport layer (ETL) and an electron inject layer (EIL).

Figure 8:
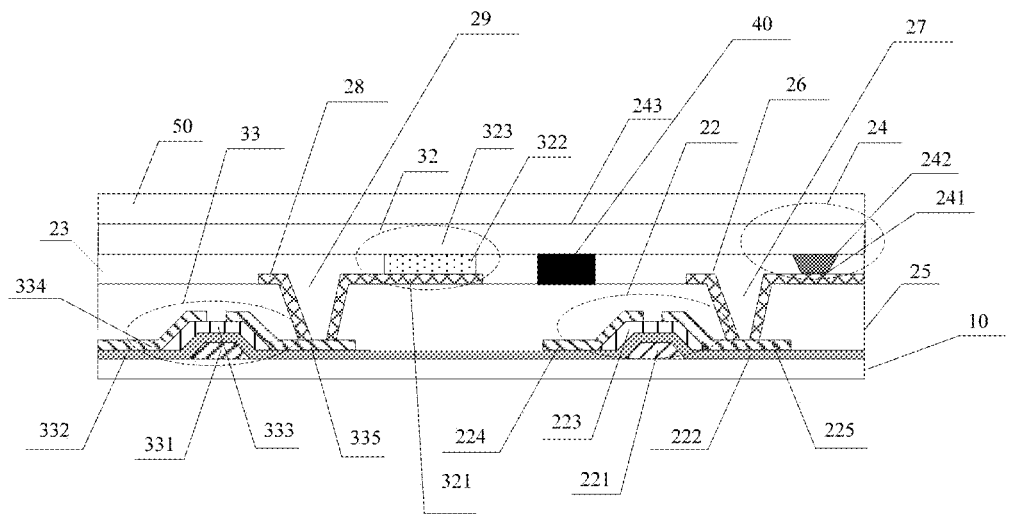
FIG. 8 shows a sectional structural diagram of an array substrate of a visible light communication device in accordance with an embodiment of the present disclosure.

Referring to FIG. 8, the array substrate of the visible light communication device in the embodiment may further include a light blocking layer 40, the light blocking layer 40 may be provided in a third opening of the pixel definition layer 23, and the third opening may be located between the first opening in which the organic light emitting element 24 is provided and the second opening in which the photosensitive sensing layer 32 of the photosensitive sensor is provided.

By providing the light blocking layer in the third opening of the pixel definition layer 23, an influence of light emitted by the organic light emitting element on the photosensitive sensor may be avoided, and the sensitivity of the photosensitive sensor for detecting signals is improved.

Providing the light blocking layer 40 in the pixel definition layer 23 also can avoid an influence of the light blocking layer 40 on an aperture ratio of the array substrate. For example, the third opening may be provided at a position of the pixel definition layer 23 between the photosensitive sensing layer 32 and the organic light emitting element 24, and the light blocking layer 40 is provided in the third opening. The light blocking layer 40 may be formed of light blocking material such as black resin, carbon black nanoparticles, chromium (Cr), or chromium oxide (CrOx).

Referring to FIG. 8, the array substrate of the visible light communication device of the embodiment may further include a protective substrate 50 provided above the input electrode 323 of the photosensitive sensing layer 32 and the second electrode 243 of the organic light emitting element, for protecting layers of pixels and photosensitive sensors on the base substrate 10.

It should be noted that, the visible light communication device of the embodiment may further include other necessary elements, which will not be limited herein.

An embodiment of the present disclosure provides a door lock including the visible light communication device as above.

The door lock is provided with the visible light communication device, and the visible light communication device includes the array substrate. The display region of the array substrate may be used for displaying images (including pictures, characters, etc.) as required, for example, displaying an interface for inputting password, or displaying current time, date, bless words (e.g., safe journey, welcome home, etc.) and any other necessary information. The photosensitive region of the array substrate is provided with at least one photosensitive sensor therein, the at least one photosensitive sensor may be used for achieving visible light communication. By integrating the photosensitive region and the display region into the single array substrate, the integration of the visible light communication device is improved, and the integration of the door lock is improved, thereby the volume and the cost of the door lock are lowered.

The door lock of the embodiment may be used in conjunction with a photonic key, and the photonic key may be used as a visible light transmitter. An unlocking password may be encoded and transmitted, through a visible light signal in a form of pulses, from the photonic key to the door lock. The visible light communication device of the door lock may be used as a visible light receiver to receive the visible light signal, the received visible light signal may be converted into an electric signal by the photosensitive sensor in the photosensitive region, other elements (such as decoder) generally provided in the door lock may be used for decoding the electric signal to obtain the unlocking password, for controlling the door lock to be unlocked.

Figure 9:
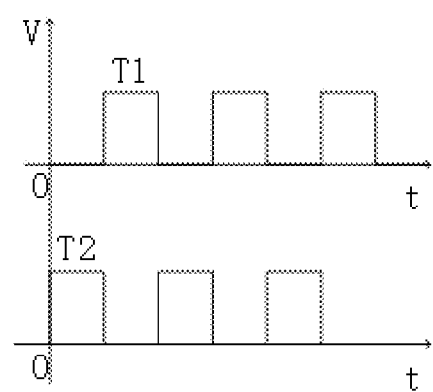
FIG. 9 shows a timing diagram of driving signals in a method for driving a visible light communication device in accordance with an embodiment of the present disclosure.

An embodiment of the present disclosure further provides a method for driving the visible light communication device as above, and as shown in FIG. 9, the method includes following steps S1 and S2.

At step S1, a photosensitive driving signal is provided to the photosensitive sensor of the visible light communication device during a first time period T1 to drive the photosensitive sensor to operate.

At step S2, a display driving signal is provided to the pixel of the visible light communication device during a second time period T2 to drive the pixel to operate.

In the embodiment, the first time period T1 is different from the second time period T2.

For the visible light communication device of the embodiment, since the photosensitive region and the display region are integrated into the single array substrate, the integration is improved and the cost is lowered. However, the light emitted by the display region may disturb and affect the photosensitive sensor receiving the visible light signal.

With the method of the embodiment for driving the visible light communication device, the photosensitive sensor and the pixel are driven in a time division mode, driving signals are respectively provided to the photosensitive sensor and the pixel during different time periods, so that the photosensitive sensor and the pixel operates during different time periods respectively.

Specifically, during the first time period T1, the photosensitive driving signal is provided to the photosensitive sensor to drive the photosensitive sensor to operate, a received visible light signal carrying encoded information may be converted into an electric signal, at this time, no image is displayed by the pixel, thus the photosensitive sensor will not be disturbed and affected.

During the second time period T2, the display driving signal is provided to the pixel for displaying an image, the photosensitive sensor will not operate, thus the pixel and the photosensitive sensor operate separately and will not influence on each other.

Timings of the first time period and the second time period may be controlled by using a synchronization signal generated by a corresponding synchronization circuit. For example, a photoelectric sensor may be provided in the photosensitive region, and in a case where a transmitter transmits a visible light signal to the photosensitive region, a start-up signal is generated by the photoelectric sensor to start up the synchronization circuit, and then according to the synchronization signal generated by the synchronization circuit, driving signals are provided to the photosensitive sensor and the pixel during different time periods respectively, so that the photosensitive sensor and the pixel operate time-divisionally.

In some implementations, a display time period for each frame of image may be divided into the first time period and the second time period, that is, in a time-divisional driving mode, the photosensitive driving signal is provided to the photosensitive sensor during the first time period, and the display driving signal is provided to the pixel during the second time period, in such way, during the display time period for each frame of image, the photosensitive sensor and the pixel operate separately, due to visual residual effect of human's eyes, the user can still see the displayed image normally when the pixel is not actually operating, meanwhile, the photosensitive sensor can also operate normally. Since the pixel is not actually operating when the photosensitive sensor is operating, the photosensitive sensor will not be disturbed and affected. Further, with the time-divisional driving mode, the visible light communication will be more safe, because the pixel may be displaying the image when the transmitter is transmitting the visible light signal, the light of the displayed image will interfere with the visible light signal transmitted from the transmitter, thereby it is difficult to acquire the original visible light signal transmitted by the transmitter, the security of the visible light communication may be improved.

Figure 10:
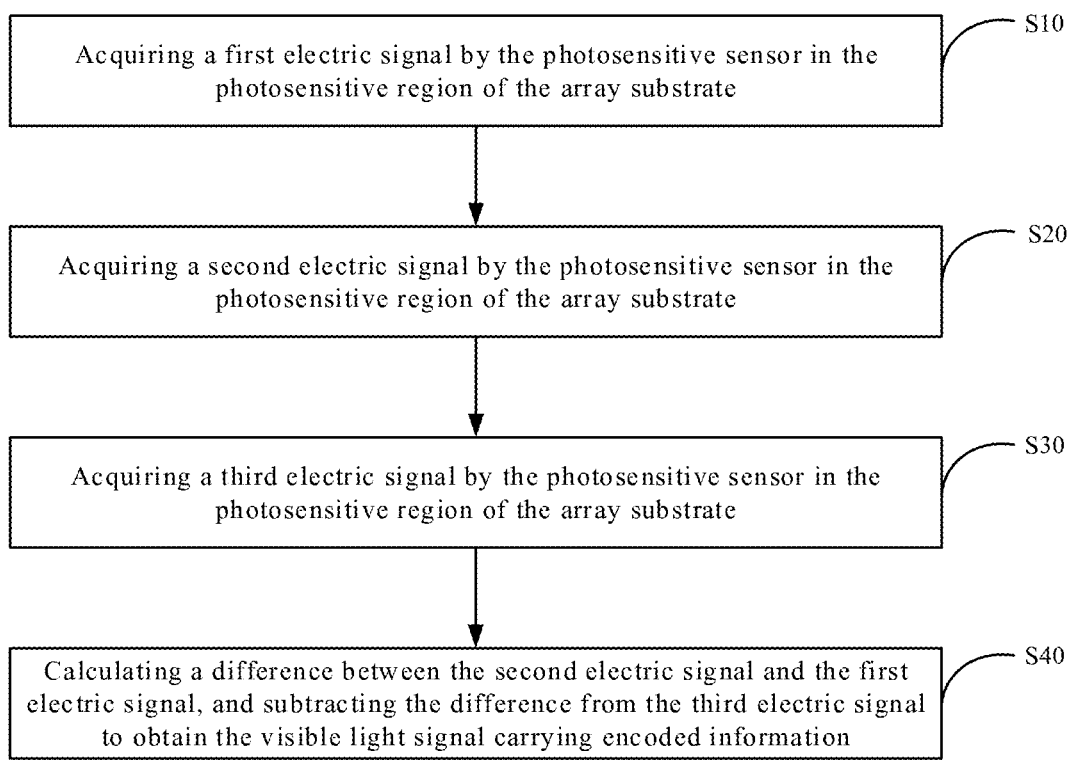
FIG. 10 shows a flow chart of a visible light communication method in accordance with an embodiment of the present disclosure.

An embodiment of the present disclosure further provides a visible light communication method applied to the visible light communication device as above. As shown in FIG. 10, the visible light communication method may include following steps S10 through S40.

At step S10, a first electric signal is acquired by the photosensitive sensor in the photosensitive region of the array substrate in a case where no visible light signal carrying encoded information arrives at the photosensitive region of the array substrate of the visible light communication device and the pixels of the display region of the array substrate are in off state (i.e., the pixels are not operating).

At step S20, a second electric signal is acquired by the photosensitive sensor in the photosensitive region of the array substrate in a case where no visible light signal carrying encoded information arrives at the photosensitive region of the array substrate of the visible light communication device and the pixels of the display region of the array substrate are in on state (i.e., the pixels are operating).

At step S30, a third electric signal is acquired by the photosensitive sensor in the photosensitive region of the array substrate in a case where a visible light signal carrying encoded information arrives at the photosensitive region of the array substrate of the visible light communication device and the pixels of the display region of the array substrate are in on state.

At step S40, a difference between the second electric signal and the first electric signal is calculated, and the difference is subtracted from the third electric signal to obtain the visible light signal carrying encoded information.

In the embodiment, interfere and influence of light of the image displayed by the pixels on the photosensitive sensor may be reduced. Specifically, in a case where the pixels in the display region of the array substrate are in off state and no visible light signal carrying encoded information arrives at the photosensitive region of the array substrate, due to a certain brightness of environment, the first electric signal is generated by the photosensitive sensor in the photosensitive region according to the brightness of environment, in a case where the pixels of the array substrate are in on state (i.e., the pixels operate to display an image) and no visible light signal carrying encoded information arrives at the photosensitive region of the array substrate, a portion of light produced by the displayed image may be received by the photosensitive sensor so that the photosensitive sensor generates the second electric signal, and in a case where the visible light signal carrying encoded information arrives at the photosensitive region of the array substrate, that is, in a case where a transmitter is transmitting the visible light signal to the photosensitive region of the array substrate, the photosensitive sensor generates the third electric signal, since the difference between the second electric signal and the first electric signal corresponds to the influence of light of the displayed image on the photosensitive sensor, by subtracting the difference from the third electric signal to obtain the visible light signal carrying encoded information, the influence of light of the displayed image on the photosensitive sensor may be eliminated, thus the obtained visible light signal carrying encoded information may be more accurate.

With respect to a general case in which the array substrate is used for displaying an image, all regions of the displayed image have a relatively uniform brightness distribution. Thus, the difference between the second electric signal and the first electric signal may be calculated by using one photosensitive sensor in the photosensitive region, then the difference may be applied to each photosensitive sensor in the photosensitive region, which can simplify the calculation and avoid using each photosensitive sensor to calculate the difference in a case where a plurality of photosensitive sensors are provided in the photosensitive region, the calculation cost may be lowered and an improved efficiency may be achieved.

In an example, each photosensitive sensor may be provided between adjacent pixels, assuming that the photosensitive sensor $S(K, J)$ in $K^{th}$ row and $J^{th}$ column is used for calculating the difference, in a case where no visible light signal carrying encoded information arrives at the photosensitive region of the array substrate and the pixels in the display region are in off state, the first electric signal acquired by the photosensitive sensor $S(K, J)$ is $L_0(K, J)$, in a case where no visible light signal carrying encoded information arrives at the photosensitive region of the array substrate and the pixels in the display region are displaying an image, the second electric signal acquired by the photosensitive sensor $S(K, J)$ is $L_1(K, J)$, and in a case where the visible light signal carrying encoded information arrives at the photosensitive region of the array substrate, the third electric signal acquired by the photosensitive sensor $S(K, J)$ is $L_2(K, J)$, thus the difference $L_{difference}=L_1(K, J)-L_0(K, J)$, thereby the visible light signal carrying encoded information is $L=L_2(K, J)-(L_1(K, J)-L_0(K, J))$.

An embodiment of the present disclosure further provides a method for manufacturing an array substrate of a visible light communication device. By taking the array substrate shown in FIG. 7 as an example, the method for manufacturing the array substrate includes following steps S100 through S109.

At step S100, a pattern including a first gate electrode 331 of a first thin film transistor 33 and a second gate electrode 221 of a second thin film transistor 22 is formed on a base substrate 10.

For example, a conductive material layer may be deposited on the base substrate 10 first, and then the conductive material layer is patterned by a first patterning process to form the pattern including the first gate electrode 331 and the second gate electrode 221.

At step 101, a gate insulation layer is formed above the pattern including the first gate electrode 331 and the second gate electrode 221.

The gate insulation layer may include a first gate insulation layer 332 and a second gate insulation layer 222. The gate insulation layer may be formed of material such as silicon oxide or silicon nitride.

At step 102, a pattern including a first active layer 333 of the first thin film transistor 33 and a second active layer 223 of the second thin film transistor 22 is formed on the gate insulation layer.

For example, a semiconductor layer may be formed on the gate insulation layer, and then the semiconductor layer is patterned by a second patterning process to form the pattern including the first active layer 333 and the second active layer 223.

At step S103, a pattern including a first electrode 334 and a second electrode 335 of the first thin film transistor 33, and a third electrode 224 and a fourth electrode 225 of the second thin film transistor 22 is formed above the pattern including the first active layer 333 and the second active layer 223.

For example, a conductive material layer may be deposited above the pattern including the first active layer 333 and the second active layer 223, and then the conductive material layer is patterned by a third patterning process to form the pattern including the first electrode 334 and the second electrode 335 of the first thin film transistor 33, and the third electrode 224 and the fourth electrode 225 of the second thin film transistor 22.

At step 104, one or more passivation layers 25 are formed above the pattern including the first electrode 334 and the second electrode 335 of the first thin film transistor 33, and the third electrode 224 and the fourth electrode 225 of the second thin film transistor 22.

For example, the passivation layer(s) 25 may be formed of material such as silicon nitride.

At step 105, a pattern including a first via-hole 27 and a second via-hole 29 is formed in the passivation layer(s) 25.

For example, the passivation layer(s) 25 may be patterned by a fourth patterning process to form the pattern including the first via-hole 27 and the second via-hole 29.

At step 106, a pattern including a first conductive layer 26 and a second conductive layer 28 is formed on the passivation layer(s) 25 formed with the pattern including the first via-hole 27 and the second via-hole 29.

For example, a conductive material layer may be deposited on the passivation layer(s) 25, and then the conductive material layer is patterned by a fifth patterning process to form the pattern including the first conductive layer 26 and the second conductive layer 28. The first conductive layer 26 may also be used as a first electrode 241 of an organic light emitting element 24, and the second conductive layer 28 may also be used as an output electrode 321 of a photosensitive sensing layer 32 of a photosensitive sensor.

For example, the conductive material as above may include, but not limited to, material such as nano-silver, graphene, carbon nanotubes, aluminium, aluminium-containing alloy or copper-containing alloy.

At step 107, a pixel definition layer 23 is formed above the pattern including the first conductive layer 26 and the second conductive layer 28.

For example, the pixel definition layer 23 may be formed of material such as silicon oxide or silicon nitride.

At step 108, a pattern including a third via-hole and a fourth via-hole is formed in the pixel definition layer 23.

For example, the pixel definition layer 23 may be patterned by a sixth patterning process to form the pattern including the third via-hole and the fourth via-hole.

At step 109, a photoelectric conversion layer 322 of the photosensitive sensing layer 32 and an organic light emitting layer 242 of the organic light emitting element 24 are formed in the pixel definition layer 23.

For example, a photoelectric conversion material layer may be formed above the pixel definition layer, and then the photoelectric conversion material layer is patterned by a patterning process to form the photoelectric conversion layer in the third via-hole.

As an example, the photoelectric conversion material layer may be deposited above the pixel definition layer by a process such as plasma enhanced chemical vapor deposition (PECVD). In some implementations, the photoelectric conversion layer 322 of the photosensitive sensing layer 32 may be formed by spin-coating photoelectric conversion material. For example, the photoelectric conversion material may be a material such as calcium iron ore. Alternatively, the photoelectric conversion material may also be a material such as organic or inorganic lead halide calcium iron ore. Specifically, the photoelectric conversion material may be $CH_3NH_3PbI_3$.

An input electrode 323 of the photosensitive sensing layer 32 may provide a bias voltage signal to the photoelectric conversion layer 322.

Various appropriate materials may be used for manufacturing the input electrode and the output electrode of the photosensitive sensing layer 32. Examples of the appropriate materials may include, but not limited to, silver nanoparticles, graphene, carbon nanotubes, aluminium, chromium, lead, copper, alloy or the like.

For example, the organic light emitting layer 242 may be formed in the fourth via-hole by an evaporation process.

At step S110, after forming the photoelectric conversion layer 322 of the photosensitive sensing layer 32 and the organic light emitting layer 242 of the organic light emitting element 24, a second electrode 243 of the organic light emitting element 24 and the input electrode 323 of the photosensitive sensing layer 32 are formed on the pixel definition layer 23.

For example, a conductive material layer may be formed on the pixel definition layer 23, and then the conductive material layer is patterned by a patterning process to form the second electrode 243 of the organic light emitting element 24 and the input electrode 323 of the photosensitive sensing layer 32, the second electrode 243 and the input electrode 323 may be coupled to each other to form a single pattern layer.

The patterning process referred to in the present disclosure may include, but not limited to, processes such as photoresist coating, exposure, development, etching, and photoresist stripping. The processes mentioned for forming or depositing layers on the base substrate may be various processes in related technologies, such as chemical vapor Deposition (CVD), plasma enhanced chemical vapor deposition (PECVD) and rapid thermochemical vapor deposition (RTCVD), which are not limited herein.

After reading the specification of the present disclosure and practicing implementations disclosed in the specification of the present disclosure, it will be conceivable for those skilled in the art to achieve other implementations of the present disclosure. The present disclosure is intended to cover various variants, uses or adaptations of the present disclosure that follow the general principles of the present disclosure and include common knowledge or common technical means in the technical field not described in detail in the present disclosure. The specification and embodiments of the present disclosure are illustrative only, and the scope and spirit of the present disclosure are defined by the appended claims.

It should be understood that, the present disclosure is not limited to the precise structures described above and shown in the drawings, and various modifications and changes can be made without departing from the scope of the present disclosure. The scope of the present disclosure is limited only by the appended claims.

The invention claimed is:

1. A visible light communication device, comprising an array substrate, the array substrate comprising a display region having a plurality of pixels and a photosensitive region having at least one photosensitive sensor;
   wherein the at least one photosensitive sensor is configured to convert a received visible light signal carrying encoded information into an electric signal,
   the at least one photosensitive sensor comprises a photosensitive sensing layer and a first thin film transistor provided above a base substrate, the photosensitive sensing layer comprises an output electrode, a photoelectric conversion layer and an input electrode provided above the base substrate successively, the first thin film transistor comprises a first gate electrode, a first gate insulation layer, a first active layer, a first electrode and a second electrode formed above the base substrate, and the output electrode of the photosensitive sensing layer is electrically coupled to the second electrode of the first thin film transistor,
   the array substrate further comprises a pixel definition layer provided above the base substrate, each of the plurality of pixels comprises a second thin film transistor and light emitting element provided above the base substrate, and
   the pixel definition layer comprises a first opening and a second opening, the light emitting element and the photosensitive sensing layer are respectively located in the first opening and the second opening, and the first thin film transistor and the second thin film transistor are located between a non-opening region of the pixel definition layer and the base substrate.

2. The visible light communication device of claim 1, wherein the photosensitive region and the display region are separated from each other.

3. The visible light communication device of claim 1, wherein the at least one photosensitive sensor is provided among the plurality of pixels.

4. The visible light communication device of claim 3, wherein the at least one photosensitive sensor comprises a plurality of photosensitive sensors, and the plurality of photosensitive sensors and the plurality of pixels are arranged alternatively.

5. The visible light communication device of claim 4, wherein the plurality of photosensitive sensors and the plurality of pixels are arranged in an array, the photosensitive sensors and the pixels in each row of the array are arranged alternatively, and the photosensitive sensors and the pixels in each column of the array are arranged alternatively.

6. The visible light communication device of claim 1, wherein the second thin film transistor comprises a second gate electrode, a second gate insulation layer, a second active layer, a third electrode and a fourth electrode provided above the base substrate, a passivation layer and the light emitting element are successively provided above the third electrode and the fourth electrode of the second thin film transistor, a first conductive layer is provided on the passivation layer, and a first via-hole is provided at a position of the passivation layer corresponding to the fourth electrode of the second thin film transistor, the first conductive layer comprises a part provided in the first via-hole and a part extending to a side of a first electrode of the light emitting element proximal to the base substrate, and the fourth electrode of the second thin film transistor is electrically coupled to the first electrode of the light emitting element through the first conductive layer.

7. The visible light communication device of claim 6, wherein the passivation layer is further provided above the first electrode and the second electrode of the first thin film transistor, a second conductive layer is provided on the passivation layer, and a second via-hole is provided at a position of the passivation layer corresponding to the second electrode of the first thin film transistor, the second conductive layer comprises a part provided in the second via-hole and a part extending to a side of the output electrode of the photosensitive sensing layer proximal to the base substrate, and the second electrode of the first thin film transistor is electrically coupled to the output electrode of the photosensitive sensing layer through the second conductive layer.

8. The visible light communication device of claim 7, wherein the first gate electrode of the first thin film transistor and the second gate electrode of the second thin film transistor are provided in a single layer, the first gate insulation layer of the first thin film transistor and the second gate insulation layer of the second thin film transistor are provided in a single layer, the first active layer of the first thin film transistor and the second active layer of the second thin film transistor are provided in a single layer, the first electrode of the first thin film transistor, the second electrode of the first thin film transistor, the third electrode of the second thin film transistor and the fourth electrode of the second thin film transistor are provided in a single layer, the light emitting element comprises the first electrode, a light emitting layer and a second electrode successively provided above the passivation layer, the first conductive layer, the second conductive layer, the output electrode of the photosensitive sensing layer and the first electrode of the light emitting element are provided in a single layer, and the input electrode of the photosensitive sensing layer and the second electrode of the light emitting element are provided in a single layer.

9. The visible light communication device of claim 1, wherein the array substrate further comprises a light blocking layer which is provided in a third opening of the pixel definition layer, and the third opening is located between the first opening and the second opening.

10. A method for driving the visible light communication device of claim 1, comprising:
providing a photosensitive driving signal to the at least one photosensitive sensor of the array substrate of the visible light communication device during a first time period to drive the at least one photosensitive sensor to operate; and
providing a display driving signal to the plurality of pixels of the array substrate of the visible light communication device during a second time period to drive the plurality of pixels to operate,
wherein the first time period is different from the second time period,
wherein a display time period of the array substrate for displaying a frame of an image is divided into the first time period and the second time period.

11. A visible light communication method for the visible light communication device of claim 1, comprising:
acquiring a first electric signal by the at least one photosensitive sensor in the photosensitive region of the array substrate in a case where no visible light signal carrying encoded information arrives at the photosensitive region of the array substrate of the visible light communication device and the pixels of the display region of the array substrate are in off state;
acquiring a second electric signal by the at least one photosensitive sensor in the photosensitive region of the array substrate in a case where no visible light signal carrying encoded information arrives at the photosensitive region of the array substrate of the visible light communication device and the pixels of the display region of the array substrate are in on state;
acquiring a third electric signal by the at least one photosensitive sensor in the photosensitive region of the array substrate in a case where a visible light signal carrying encoded information arrives at the photosensitive region of the array substrate of the visible light communication device and the pixels of the display region of the array substrate are in on state; and
calculating a difference between the second electric signal and the first electric signal, and subtracting the difference from the third electric signal to obtain the visible light signal carrying encoded information.

12. A door lock comprising a visible light communication device, the visible light communication device comprises an array substrate, the array substrate comprising a display region having a plurality of pixels and a photosensitive region having at least one photosensitive sensor, wherein the at least one photosensitive sensor is configured to convert a received visible light signal carrying encoded information into an electric signal,
the at least one photosensitive sensor comprises a photosensitive sensing layer and a first thin film transistor provided above a base substrate, the photosensitive sensing layer comprises an output electrode, a photo-electric conversion layer and an input electrode provided above the base substrate successively, the first thin film transistor comprises a first gate electrode, a first gate insulation layer, a first active layer, a first electrode and a second electrode formed above the base substrate, and the output electrode of the photosensitive sensing layer is electrically coupled to the second electrode of the first thin film transistor, the array substrate further comprises a pixel definition layer provided above the base substrate, each of the plurality of pixels comprises a second thin film transistor and a light emitting element provided above the base substrate, and the pixel definition layer comprises a first opening and a second opening, the light emitting element and the photosensitive sensing layer are respectively located in the first opening and the second opening, and the first thin film transistor and the second thin film transistor are located between a non-opening region of the pixel definition layer and the base substrate.

\* \* \* \* \*